(12) United States Patent
Randhawa

(10) Patent No.: US 9,799,536 B2
(45) Date of Patent: Oct. 24, 2017

(54) APPARATUS AND METHOD FOR CLEANING FLAT OBJECTS IN A VERTICAL ORIENTATION WITH PULSED LIQUID JET

(75) Inventor: Rubinder Randhawa, Dublin, CA (US)

(73) Assignee: Planar Semiconductor, Inc., San Jose, CA (US)

( * ) Notice: Subject to any disclaimer, the term of this patent is extended or adjusted under 35 U.S.C. 154(b) by 598 days.

(21) Appl. No.: 11/269,250

(22) Filed: Nov. 9, 2005

(65) Prior Publication Data

US 2006/0174919 A1   Aug. 10, 2006

Related U.S. Application Data

(60) Provisional application No. 60/650,572, filed on Feb. 7, 2005.

(51) Int. Cl.
  *H01L 21/67* (2006.01)
  *B08B 3/02* (2006.01)

(52) U.S. Cl.
  CPC .......... *H01L 21/67051* (2013.01); *B08B 3/02* (2013.01); *B08B 3/024* (2013.01); *B08B 2203/02* (2013.01)

(58) Field of Classification Search
  CPC .......................... H01L 21/67051; B08B 3/02
  USPC .. 134/34, 85, 198, 902, 199, 184, 63, 76, 1, 134/1.3, 33, 153; 156/345.11
  See application file for complete search history.

(56) References Cited

U.S. PATENT DOCUMENTS

| | | | |
|---|---|---|---|
| 5,468,302 A * | 11/1995 | Thietje | ............................. 134/1 |
| 5,685,086 A | 11/1997 | Ferrell | |
| 5,933,902 A | 8/1999 | Frey | |
| 6,082,377 A | 7/2000 | Frey | |

(Continued)

FOREIGN PATENT DOCUMENTS

| | | |
|---|---|---|
| JP | S62-173718 | 7/1987 |
| JP | 2004-281429 | 10/2004 |

OTHER PUBLICATIONS

Rockwell Automation, "Planar Semiconductor Inc. partners with Rockwell Automation to cut development time by 9 months, reduce costs by nearly US$2 million", Oct. 2003.*

(Continued)

*Primary Examiner* — Michael Kornakov
*Assistant Examiner* — Natasha Campbell
(74) *Attorney, Agent, or Firm* — Schwegman Lundberg & Woessner, P.A.

(57) ABSTRACT

An apparatus for cleaning flat objects such as semiconductor wafers with a pulsed liquid jet emitted from a group of nozzles that may be installed on one or on both sides of the wafer installed in a vertically arranged rotating chuck. The apparatus is comprised of a series of individual processing units, such as a loading unit, cleaning units, drying unit, and an unloading unit arranged circumferentially around a universal industrial robot capable of reaching any of the units and transferring the wafers between the units. Drying is carried out in a horizontal position of the wafer and may combine spin-dry with chemical treatment for accelerating the drying process and for improving quality of the drying process. All units are located in a sealed enclosure with a controlled purity of the atmosphere inside the enclosure. Method of cleaning is also disclosed.

18 Claims, 8 Drawing Sheets

(56) References Cited

U.S. PATENT DOCUMENTS

| | | | |
|---|---|---|---|
| 6,592,677 B1 | 7/2003 | Tomimori et al. | |
| 6,612,014 B1* | 9/2003 | Donoso et al. | 29/559 |
| 6,637,446 B2* | 10/2003 | Frost et al. | 134/184 |
| 6,866,723 B2 | 3/2005 | Ueda et al. | |
| 2002/0139389 A1* | 10/2002 | Treur | 134/1.3 |
| 2002/0166569 A1* | 11/2002 | Harvey | C11D 7/06 134/1 |
| 2003/0029479 A1* | 2/2003 | Asano | B08B 1/04 134/18 |
| 2003/0079762 A1* | 5/2003 | Husain | H01L 21/67028 134/30 |
| 2003/0136431 A1* | 7/2003 | Scranton et al. | 134/63 |
| 2004/0206371 A1 | 10/2004 | Bran | |
| 2005/0126030 A1 | 6/2005 | Ohmi et al. | |

OTHER PUBLICATIONS

U.S. Appl. No. 60/650,572, filed 2005, R. Randhawa.

"A novel approach to metal lift-off for GaAs ICs" by Mehran Janani (http://www.compoundsemiconductor.net/articles/magazine/9/10/31).

"Demonstrating a contamination-free wafer extraction system for use with CE and IC" by Peng Sun, et al. (http://www.micromagazine.com/archieve/99/04/sun.html).

Janani, Mehran, et al., "Rapid Pulse Harmonic Spray Technology (R-PHAST)—A Novel technique for wafer cleaning and lift-off applications for GaAs manufacturing", (Dec. 2004), 7 pgs.

"U.S. Appl. No. 11/299,134, Advisory Action dated Jan. 12, 2016", 3 pgs.

"U.S. Appl. No. 11/299,134, Final Office Action dated Oct. 2, 2015", 11 pgs.

"U.S. Appl. No. 11/299,134, Response filed Dec. 2, 2015 to Final Office Action dated Oct. 2, 2015", 15 pgs.

"U.S. Appl. No. 11/299,134, Appeal Brief filed May 2, 2016", 21 pgs.

"U.S. Appl. No. 11/299,134, Pre-Appeal Brief filed Mar. 2, 2016", 5 pgs.

* cited by examiner

APPARATUS AND METHOD FOR CLEANING FLAT OBJECTS IN A VERTICAL ORIENTATION WITH PULSED LIQUID JET

CROSS-REFERENCES TO RELATED APPLICATIONS

The present patent application is related to provisional U.S. Patent Application No. 60/650,572 filed by R. S. Randhawa on Feb. 7, 2005, entitled "Vertical Rapid Pulse Spin Processing of Semiconductor Wafers for Wet Clean Application" on which the present application is based upon.

FIELD OF THE INVENTION

The present invention relates to the field of cleaning of flat objects, in particular to wet cleaning of semiconductor wafers in the process of their production.

DESCRIPTION OF THE PRIOR ART

Cleaning of surfaces of wafer substrates is one of the most important steps in the fabrication of semiconductor microelectronic devices. It is well known that the presence of chemical contaminants and particles of impurities may significantly reduce the yield of the products and noticeably affect the performance and reliability of the produced semiconductor devices.

In view of the present trend in the semiconductor industry that go far beyond the submicron sizes of the device features, the effective techniques for cleaning silicon wafers, e.g., initially and after oxidation and patterning, are now more important than ever before because of the extreme sensitivity of the semiconductor surfaces to the presence of contaminants. Specifically, total metallic impurities should be far less than $10^{10}$ atoms per $cm^2$. Presence of particles larger than 0.1 µm in size should be much less than approximately 0.1 per $cm^2$. This means that 30 particles, e.g., on the 200 mm wafer, may be considered as a threshold of cleanliness.

In view of the fact that the above criteria are very stringent, the efficiency of the equipment and processes used for wafer cleaning should be evaluated from the point of view of satisfaction of the above requirements in the treated wafers.

There exist a plurality of various methods and processes for wafer cleaning that roughly can be subdivided into dry-physical, wet-physical, combined wet physical/chemical, vapor-phase methods, etc. Furthermore, there exists a series of apparatuses for implementing the aforementioned cleaning processes in the industry.

In a majority of cases, the cleaning processes are oriented specifically on silicon since this material is a basis for fabrication of integrated circuits.

The present invention pertains to the aforementioned wet-physical and combined wet physical/chemical processes, which are most widely used for cleaning of semiconductor wafers. The wet cleaning methods and apparatuses, in turn, have a plurality of different implementations with vertical or horizontal orientation of singles or multiple wafers performing different specific movements during the cleaning cycle, the use of different cleaning media and tools, the use of different methods for drying, etc.

For example U.S. Pat. No. 5,468,302 filed by J. Thietje on Nov. 21, 1995, entitled "Semiconductor Wafer Cleaning System" relates to a semiconductor wafer cleaning system for cleaning semiconductor wafers intended for circuitry in small geometric structures of 0.3 µm or less. The apparatus includes successively arranged wafer loading, washing, drying and unloading stations, each having an individual closable enclosure. Also included in the apparatus is a device for storing a number of wafers in a vertical plane within the enclosures of the loading and unloading stations, a device for transporting a sequence of individual wafers, a device for rotating the wafers and a high pressure jet for simultaneously cleaning opposite surfaces of the wafers.

An advantage of the cleaning system of U.S. Pat. No. 5,468,302 consists of vertical arrangement of the wafers that improves contamination removal conditions. However, the apparatus has substantial longitudinal dimensions and occupies a large space. Furthermore, the apparatus demands the use of a special loading/unloading robot that has to cover a large operational span. Longitudinal arrangement of the working sections may extend the cycle time for some sequences of treatment.

U.S. Pat. No. 6,592,677 issued to H. Tomimori, et al. on Jul. 15, 2003 describes a method of forming a semiconductor device by simultaneously cleaning both sides of a wafer using different cleaning solutions. In particular, the invention is aimed at removing a Cu-contamination from a wafer surface having a Cu-based metal region. The method comprises the step of carrying out a cleaning process by use of a cleaning solution free of HF and capable of oxidation to the wafer surface for not only removing the Cu-contamination from the wafer surface but also oxidizing the wafer surface to cause the wafer surface to have a hydrophilicity. The process-cleaning tool contains cleaning medium nozzles for injecting the cleaning medium onto the wafer surface and cleaning roller-type brushes for post treatment. The apparatus may operate in different modes by selecting different sequences and operation conditions for pre-cleaning and post-cleaning steps.

A main disadvantage of the system of U.S. Pat. No. 6,592,677 consists of horizontal arrangement of the wafer planes that does not allow efficient removal of contaminants from the upper face of the wafer.

US Patent Application Publication No. 20050126030 issued to T. Ohmi, et al. on Jun. 16, 2005 discloses a rotary silicon wafer cleaning apparatus. According to the invention, a rotation type silicon wafer cleaning device has a silicon wafer support/rotation driving mechanism inside the case body for cleaning the silicon wafer at the post-chemical cleaning with pure water, drying and hydrogen-termination treatment of the outer surface of a silicon wafer. The apparatus includes: a gas supply panel attached to a case body to supply a mixed gas of the hydrogen gas and inactive gas containing a hydrogen gas of more than 0.05%; a mixed gas supply pipe coupled to a gas mixer of the aforementioned gas supply panel at one end; a mixed gas heating device to heat the mixed gas in the aforementioned gas supply pipe; and a hydrogen radical formation apparatus equipped with a platinum coating film to form hydrogen radical at the gas contacting part. In this part, a high temperature gas heated with the aforementioned mixed gas heating device. After cleaning is completed, the silicon surface is treated with the aforementioned hydrogen-radical-containing gaseous mixture. A disadvantage of the apparatus is a limited specific application.

U.S. Pat. No. 5,685,086 issued on Nov. 11, 1997 to Gary Ferrell discloses a method and apparatus for drying objects using aerosols. The objects are submerged in a rinse liquid in an enclosed chamber, and aerosol particles from a selected drying liquid are introduced into the chamber above the rinse liquid surface, forming a thin film on this surface. As the rinse liquid is slowly drained, some aerosol particles settle onto and form a film on the exposed surfaces of the objects, and displace and remove rinse liquid residues from the exposed surfaces. Surface contaminants are also removed by this process. A disadvantage of this system resides in horizontal orientation of the wafer plane during treatment.

U.S. Pat. No. 5,933,902 issued on Aug. 10, 1999 to B. Frey discloses a wafer cleaning and drying apparatus that comprises a vertical wafer drive assembly for two-sided wafer cleaning by symmetrically disposed brushes. Each wafer brush comprises two parallel rotatable shafts within the lumen of a substantially tubular sponge, with an adjustable distance between the two shafts, which is narrowed to facilitate insertion into the sponge and widened to stretch the sponge into a substantially oval cross-sectional shape, thereby improving traction. One or more nonrotating perforated fluid delivery tubes are mounted within the lumen of the sponge in the space between the two shafts. The apparatus further comprises a minimal volume rinse/dry enclosure that conserves water and process chemicals; and a wafer transport assembly configured to transfer multiple wafers simultaneously between multiple process stations. Although the system is characterized by a vertical arrangement of the wafers, the rotating brushes themselves produce products of abrasive wear that creates secondary contamination. Therefore, such a system is not suitable for super-fine cleaning.

U.S. Pat. No. 6,082,377 issued on Jul. 4, 2000 also to B. Frey is aimed at improvement of the system disclosed in U.S. Pat. No. 5,933,902. However, the problems associated with the use of brushes remain unsolved.

U.S. Pat. No. 6,866,723 to Takeji Ueda, et al. issued on Mar. 15, 2005 describes a wet cleaning process and wet cleaning equipment. A substrate is treated with a desired liquid while revolving the substrate around an axis of rotation outside the substrate such that the liquid flowing on a surface of the substrate is maintained flowing under a centrifugal force greater than gravitation. The substrate is treated while supplying the liquid at a flow rate at least equal to a discharge rate of the liquid only in a direction conforming with that of the centrifugal force or with that of a flow of the liquid flowing on the surface of the substrate under the centrifugal force. The substrate surface is evenly treated with the liquid while avoiding flows of the liquid running against each other or a flow of the liquid stagnating on the surface of the substrate. A main disadvantage of the system is horizontal orientation of the wafers during treatment that does not provide efficient removal of very small contamination particles from the upper face of the wafer.

US Patent Application Publication No. 20040206371 published on Oct. 21, 2004 to Mario Bran describes a wafer cleaning apparatus with horizontal orientation of the wafers. The apparatus utilizes a megasonic energy to agitate cleaning fluid applied to the wafer. A source of energy vibrates an elongated probe, which transmits the acoustic energy into the fluid. The probe has a solid cleaning rod and a flared or stepped rear base. In one form, the probe is made of one piece, and in another, the rod fits into a socket in the base. This enables a rod to be made of material, which is compatible with the cleaning solution, while the base may be of a different material. A heat transfer member acoustically coupled to the probe base and to a transducer conducts heat away from the transducer. A housing for the heat transfer member and the transducer supports those components and provides means for conducting coolant through the housing to control the temperature of the transducer. In another arrangement, an end of the housing is coupled between the transducer and the probe. In one arrangement, fluid is sprayed onto both sides of a wafer while a probe is positioned close to an upper side. In another arrangement, a short probe is positioned with its end face close to the surface of a wafer, and the probe is moved over the wafer as it rotates. The probe may also be positioned through a central hole in a plurality of discs to clean a group of such elements at one time. The above described system is representative of a group of patents with the horizontal wafer orientation, and therefore the disadvantages described above in connection with the system having horizontal wafer arrangement are also inherent in the apparatus of US Patent Application Publication No. 20040206371. Japanese Laid-Open Patent Application Publication No. 2004-281429 published on Oct. 7, 2004 to H. Nobata relates to a wet cleaning device that can be improved further in cleaning effect by satisfactorily removing foreign matters by utilizing a liquid flow discharged by means of a centrifugal force without inhibiting the liquid flow. The device is provided with a nozzle of a special configuration used for wet cleaning by jetting a pressurized cleaning fluid upon the surface of the rotating wafer that alternates with a gaseous jet cleaning through the same nozzle from a separate gas source. The wafer has a horizontal orientation with inherent disadvantages, while the use of gaseous and liquid fluids supplied through the same nozzle demands implementation of a complicated fluid distribution and sealing system.

Furthermore, when the cleaning system has a horizontal orientation of the wafers, problems always occurs in the cleaning apparatus in view of dripping of drops of condensate from the upper wall of the closed processing chamber onto the upper face of the wafer that has been cleaned but is still located in the processing chamber.

The same disadvantage is inherent in the system of US Patent Application Publication No. 2004132318 published on Jul. 8, 2004 to K. Young Bae, et al. that utilizes a rotatable wafer supporting assembly with a cylindrical body. The rotatable wafer supporting assembly may include wafer-holding mechanisms with pivotable confining members that are configured to hold the substrate using centrifugal force when the wafer supporting assembly is rotated. In an embodiment, the cleaning system may include a positioning system operatively connected to an acoustic transducer to provide meaningful control of the acoustic energy applied to the surface of the substrate by selectively changing the distance between the acoustic transducer and the substrate surface so that the substrate can be cleaned more effectively.

Attempts have been made so far to improve efficiency of wet wafer cleaning system with horizontal orientation of the wafer by improving modes of operation, e.g., by multiple repetition of the cleaning cycle. An example of such an improvement is described in Japanese Laid-Open Patent Application Publication No. S62-173,718 published on Jul. 30, 1987 to T. Iwata. In this device, a semiconductor wafer is rotated at constant speed by a chuck. A pulse signal having predetermined device characteristics is transmitted over a stepping motor, and a cleaning fluid such as pressurized water or the like is sprayed against the surface of the wafer, while a nozzle of cleaning fluid is moved slowly in the peripheral section of the wafer and shifted fast with an approach to the central section of the revolution of the wafer. Consequently, the cleaning fluid in uniform quantity is sprayed against the whole surface of the wafer. The working cycle consists of two or more half-periods of swinging of the pivotal nozzle across the wafer surface. In other words, in the above-described system, the cleaning liquid is discharged from the nozzle at a constant speed of flow while the nozzle itself moves across the wafer with a variable speed, e.g., with a speed that is higher at the wafer center where points on the wafer surfaces rotate with the minimal linear speed on the wafer surface and with a speed lower at the wafer edges where points on the wafer surface have high linear speed. This means, that the system provides more uniform flow rate of the cleaning liquid over a unit of the surface area of the wafer.

SUMMARY OF THE INVENTION

It is an object of the present invention to provide an apparatus for cleaning flat objects such as semiconductor wafers that has a compact design, ensures the highest degree of cleaning in handling the wafers by using separate end effectors for unprocessed (contaminated) and processed (clean) objects, is characterized by a vertical arrangement of the object plane, efficiently removes contaminants from the object surface with pulsed jets of the cleaning liquid, completely removes the drops of the cleaning liquid from the surface of the object during drying, and stabilizes the cleaning by selecting an appropriate pulse spray modes. It is another object to provide an improved method of cleaning flat objects such as semiconductor wafers that is characterized by high cleaning efficiency due to the use of optimized pulsed jets and by high drying efficiency due to the use of a special turbo-spin dry module that may optionally operate in combination with a nitrogen blow. Another object of the invention to improve efficiency of cleaning and increase production efficiency due to the use of separate end-effectors for unprocessed and processed objects.

The apparatus of the invention has a compact design. The entire system is enclosed in a sealed and filtered cabinet that also has all mechanical, electrical and plumbing components mounted in it. Located in the center of the cabinet is a universal industrial robot, e.g., a clean-room class robot, which is surrounded by separate processing units that are attached to the inner walls of the cabinet or stand alone and are reachable by the mechanical arm of the common robot. These processing units are the following: input and output cassettes for flat objects, i.e., semiconductor wafers, a flat object cleaning unit with a rapid pulse harmonic spray unit, and a drying unit. The robot may be a unit of any known type suitable for loading/unloading semiconductor wafers into and from a wafer cassette. In the embodiment illustrated below the robot has six degrees of freedom and a pair of end effectors, one for handling the wafers prior to cleaning and another for handling the wafers after cleaning. When one end effector is in an operative position, another one is in a non-operative position. The wafers are taken from the cassette in a horizontal position which is more convenient for storage and are flipped into a vertical position which is more efficient for cleaning in a cleaning unit. The latter contains circumferentially arranged rollers that hold a semiconductor wafer in a vertical position and rotate it with a predetermined speed relative to a pair of stationary nozzle units located on both sides of the wafer. Each of the nozzle units is arranged diametrically across the wafer and contains a plurality of spray nozzles which operate in so-called rapid-pulse harmonic spray mode.

The inventor herein has modified and further developed the rapid-pulse harmonic spray technology by providing a specific arrangement of nozzles for injecting discrete droplets of pulsed fluid streams of specific size selected to match a specific application. The jets are created by means of an electrical three-diaphragm short piston pump. Cleaning is carried out with the use of predetermined ultra pure chemistries along with deionized-water rinsing of the water surface. Rapid pulsed streams of chemistry and deionized water are fired in time succession to clean and rinse the water surface, front and backside, although it is not a requisite to clean the back side, if not desired. Once the wafer is cleaned based upon the application or the cleaning step, the robot arm that has its first end-effector still in a vertical position, turns in a vertical plane to align the second end-effector with the position of the vertically arranged wafer, and then picks up the wafer from the pulse clean chamber. The robot arm is turned to a horizontal position and transfers the cleaned wafer to a drying unit. In the drying unit, the wafer edges are gripped with centrifugally driven gripping fingers, and the wafer is subjected to spin dry without splash back. Optional use of heated or room temperature nitrogen can be used to dehydrate the wafer quickly to prevent any water spots formation on the surface. Chemistry can be optionally used at this step for re-wetting and ultra fast drying. After drying, the wafer is delivered to the output cassette by the robot by the "clean" end-effector. If necessary, one combined cassette can be used for loading and unloading. The clean and dry wafer is loaded into the output cassette. The system uses an off the shelf motion control system that is controlled by a central host computer.

DETAILED DESCRIPTION OF THE INVENTION

Figure 1:
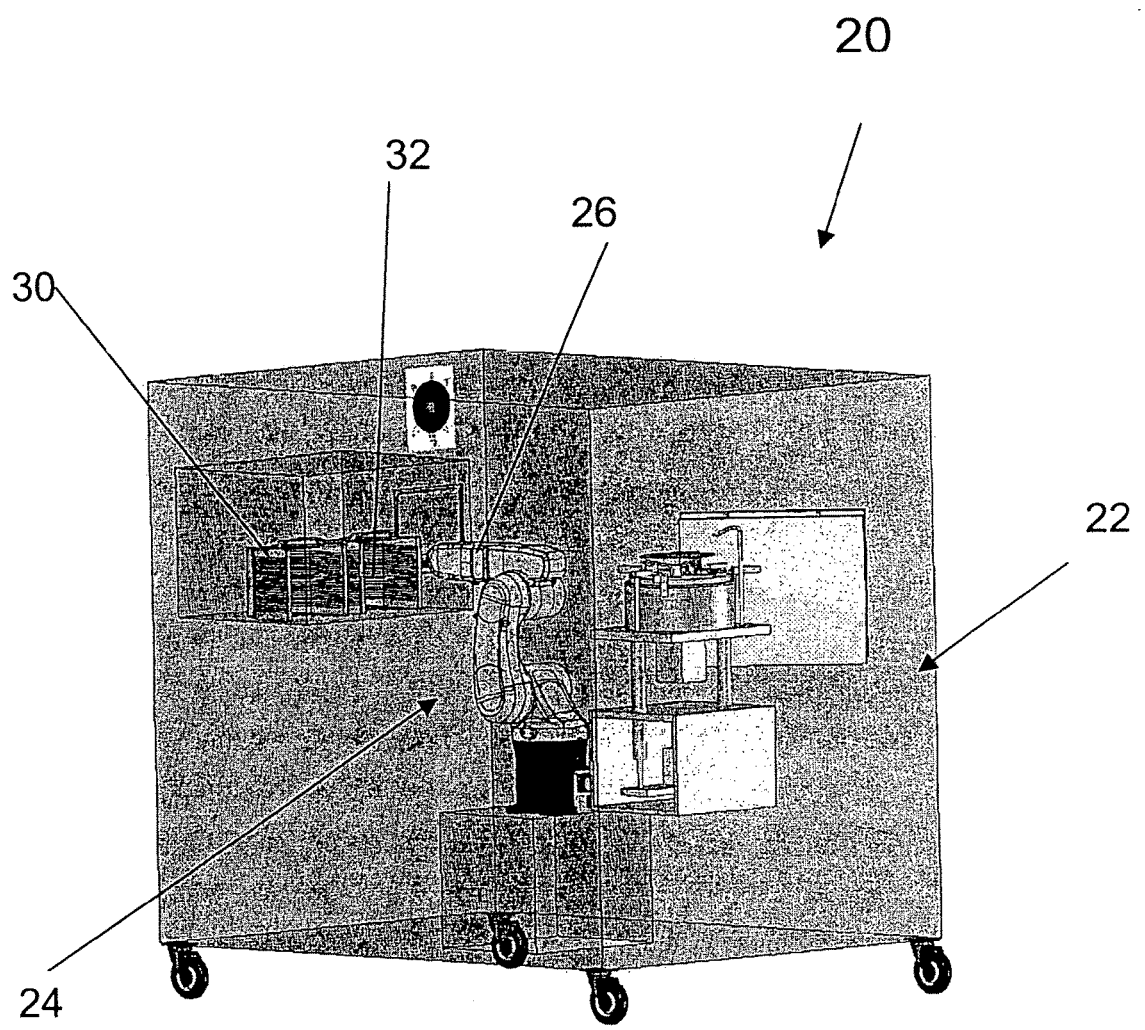
FIG. 1 is a general three-dimensional view of the apparatus of the invention.

As shown in FIG. 1, which is a three-dimensional view of the apparatus of the invention, the apparatus has a compact design. The apparatus as a whole is designates by reference numeral 20. All working units are enclosed in a sealed and filtered cabinet or enclosure 22 having means for controlling degree of cleanliness of the atmosphere in said enclosure, which also has all mechanical, electrical and plumbing components mounted in it. For the sake of convenience all walls of the cabinet 22 are shown transparent although in reality the cabinet or enclosure is made from a stainless steel, aluminum alloy or aluminum-zinc alloy with transparent sealed windows (not shown). The cabinet 22 may be comprised of a class 1 self-powered ULPA-filter cabinet, called "Front End". ULPA (Ultra Low Penetration Air) is a filtering efficiency specification for filters used in environments like pharmaceutical labs or semiconductor manufacturing facilities where the highest degree of clean air must be maintained. An ULPA filter must retain all particles to 0.12 µm in size at an efficiency rating of 99.999%. Certified ULPA filters are tested and marked with a certification number, which gives the user the assurance that the stated specification is actually being achieved by the filter. It is very important to have a completely sealed system so all air flow must pass through the ULPA filter to be cleaned by it. The ULPA filter is driven from a high-efficiency motor blower unit (not shown).

Located in the center of the cabinet is a universal cleanroom class robot 24, which is surrounded by separate processing units that are attached to the inner walls of the cabinet or stand alone and are reachable by the mechanical arm 26 of the robot 24. These processing units are the following: an input wafer cassette 28, an output wafer cassette 30, a rapid pulse harmonic spray unit 32 located in the flat object cleaning unit 31 shown in FIG. 2, which is a top view of the apparatus 20 of FIG. 1, and a drying unit 34. Each of the aforementioned units will be considered separately in more detail.

Although the objects treated in the apparatus of the invention are described as semiconductor wafers, it should be understood that the field of application of the present invention is not limited only to semiconductor wafers and that the principle of the inventions is applicable to any flat and particularly thin flat and round objects such as substrates for compact disks, hard drive disks, etc.

Figure 3:
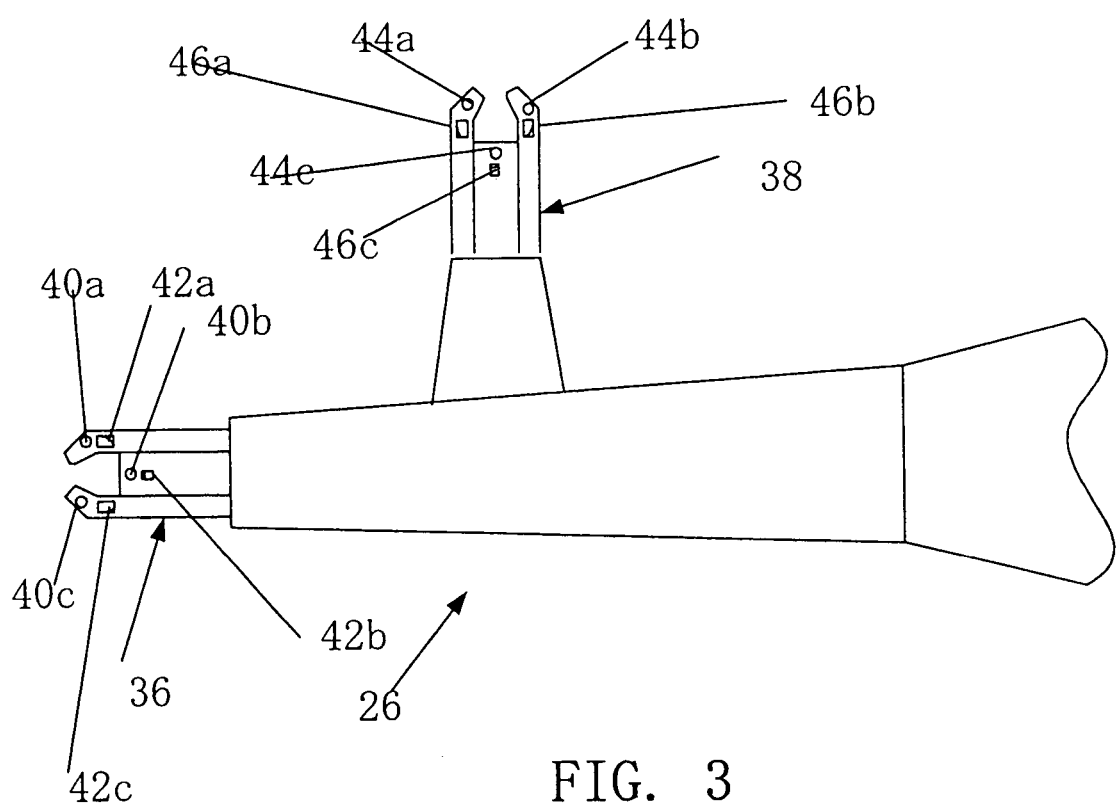
FIG. 3 is a top view of a robot arm of the apparatus of the invention, when the arm with two end-effector is oriented for handling the wafers with the first end effector in a horizontal position.

The robot 24 may be a unit of any known type suitable for loading/unloading semiconductor wafers into and from a wafer cassette. In the illustrated embodiment the robot 24 is a 6-axis manipulator with suitable end effectors, housed in an enclosure with ULPA filter. Thus, the robot arm 26 may change positions between orientation in a vertical plane or a horizontal plane and can be turned in any of these planes for a required angle. The robot arm 26 is shown in FIG. 3, which is a plan view of the robot arm 26 when the latter is oriented in a horizontal plane. It can be seen that the robot arm has two end-effectors 36 and 38, which are arranged perpendicular to each other. The first end-effector 36 is intended for handling unprocessed wafer, i.e., wafer prior to cleaning in the cleaning unit 32. It has suction ports 40a, 40b, 40c and wafer centering pads 42a, 42b, 42c. The second end-effector 38 has a similar structure with suction ports 44a, 44b, 44c and wafer centering pads 46a, 46b, 46c but is arranged perpendicular to the direction of the first end-effector 36 and at a certain distance from the letter in the longitudinal direction of the mechanical arm 26. The end-effectors shown in FIG. 3 are given only as examples, and end-effectors of any other type, e.g., with gripping pins, can be used for the purposes of the invention.

Figure 2:
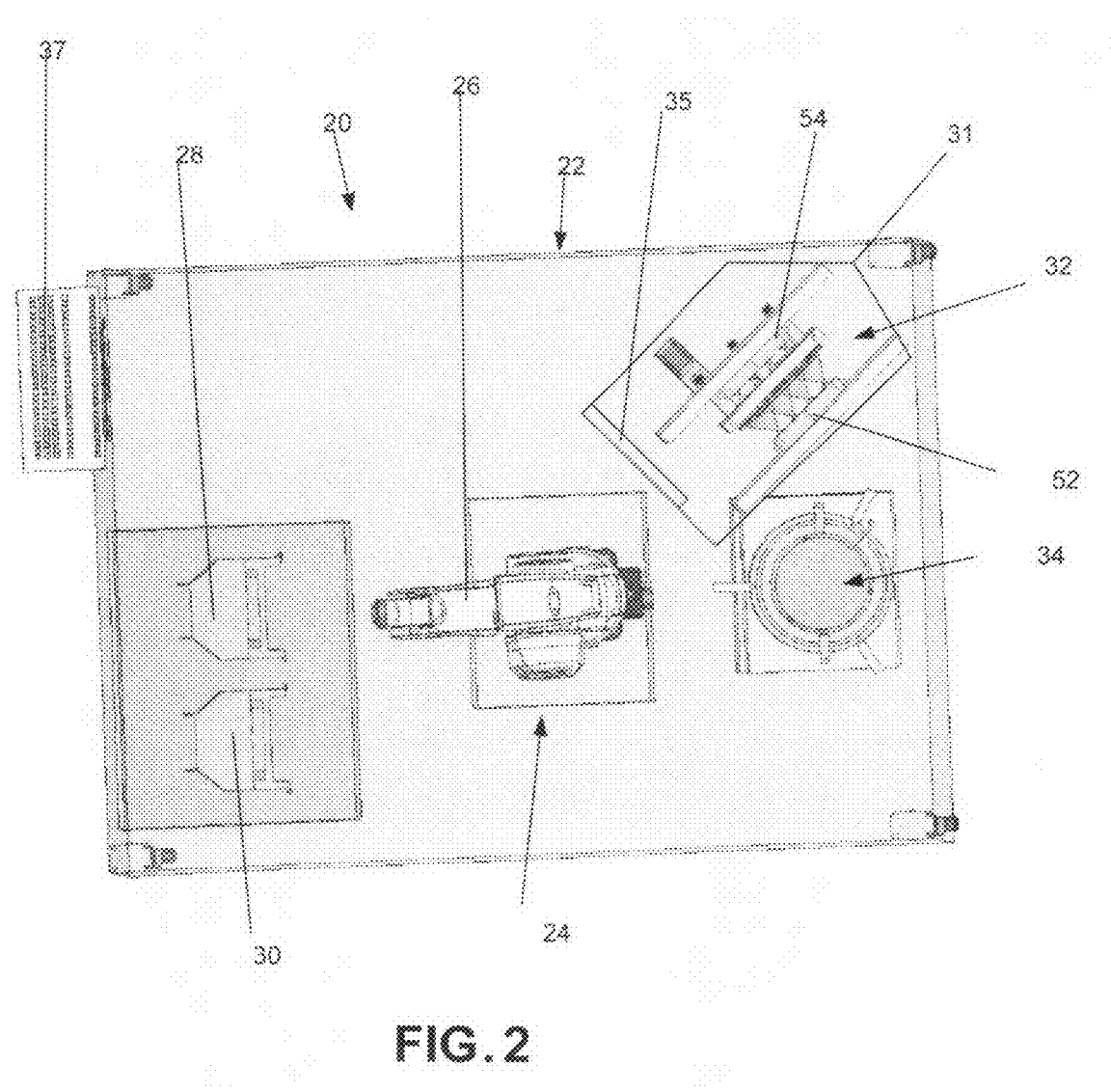
FIG. 2 is a top view of the apparatus of FIG. 1 that shows relative arrangement of the units.
Figure 4:
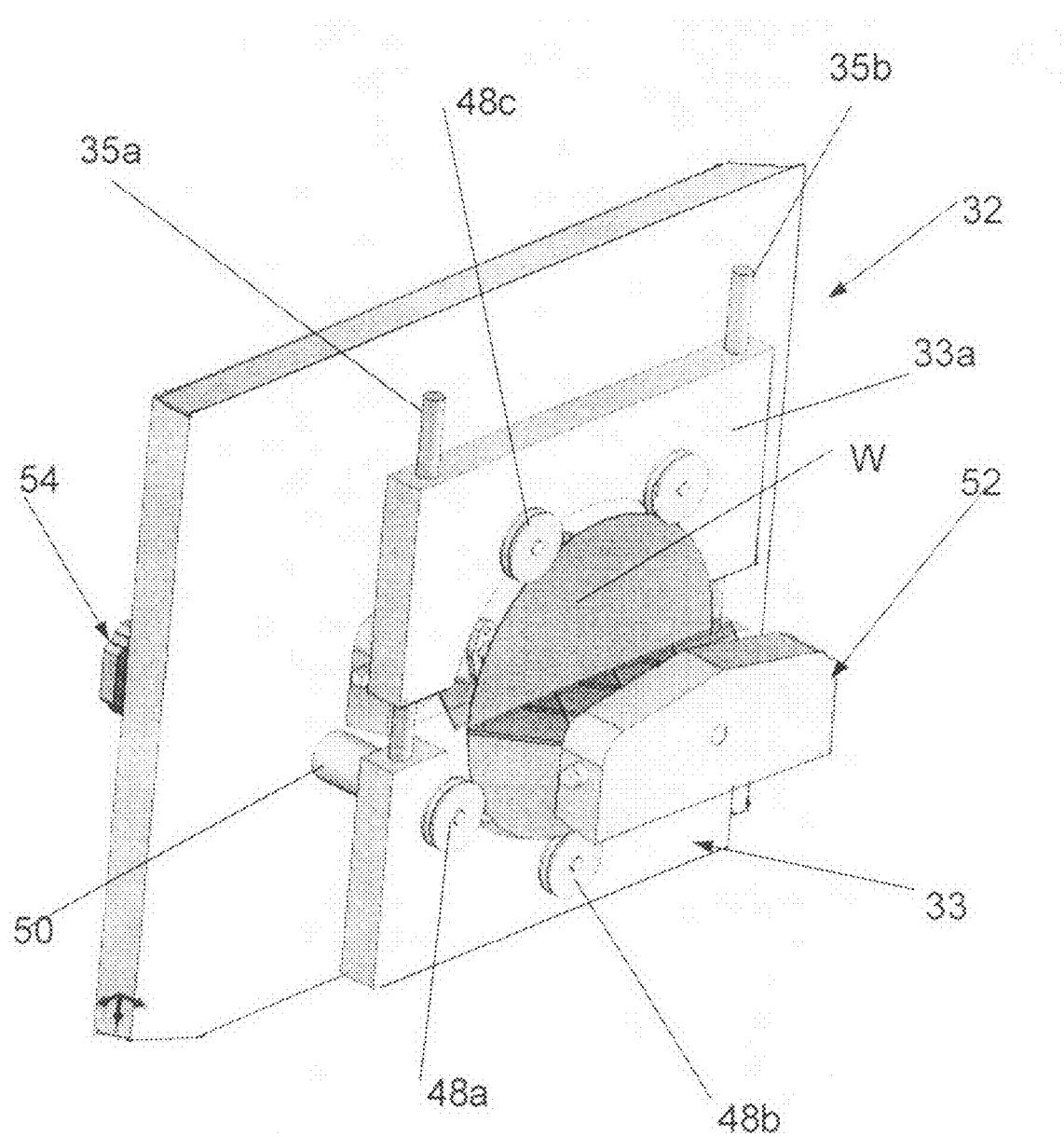
FIG. 4 is a three-dimensional view of a rapid pulse harmonic spray unit of the apparatus of the invention.

The next unit in a clockwise direction of robot arm rotation from the inlet wafer cassette (FIG. 3) is the cleaning unit 31 that is shown in more detail in FIG. 4. The front side of the unit 31 has a gate valve 35 (FIG. 2) that opens and closes upon software command from the system graphical user interface 37 (FIG. 2). Once the valve 37 closes, the processing of the wafer starts.

The principles of rapid-pulse harmonic spray technology are described by Mehran Janani, et al. in the article, "A novel approach to metal lift-off for GaAs ICs" in the Compound-semiconductor.net Magazine, published Oct. 28, 2003.

The fluid droplets in each pulse interact with the wafer, which rotates slowly in a vertical orientation, to produce a hybrid of laminar and turbulent flow types. Rapid pulsing controls the fluid-mechanical interactions of jets and droplets with any adsorbed contaminants. As a result the chemical concentration gradient at the wafer/liquid interface is always positioned to favor desorption of contaminants. The moderate application of a pressurized solvent allows for a blend of mechanical and chemical energy for lift-off applications. Large particles are removed at the point of impact of the pulse spray due to the generation of turbulent flow. In the laminar flow regime where the boundary layer is less than 1 µm, the solvent is responsible for dispersing and rinsing small particles and labile layer removal. Compared with the use of other technologies that use fluids at super critical pressures aided with co-solvents, dry $CO_2$/liquid approaches and jet sprays, the rapid pulse approach manipulates all of the essential thermal, mechanical, and chemical ingredients for effective cleaning, thereby offering a simple, elegant and cost-effective solution.

The inventor herein has modified and further developed the rapid-pulse harmonic spray technology by providing a specific arrangement of nozzles for injecting discrete droplets of pulsed fluid streams of specific size selected to match a specific application. The proposed design of the nozzles makes it possible to extremely quickly change the jet outflow speed. This in turn, allows for noticeable increase in the efficiency of cleaning. The rapid pulse harmonic spray technology that has been developed by the inventors relies on firing in rapid succession a pulse train of fluid droplets that causes a hybrid fluid flow at the substrate jet interface.

The rapid pulse harmonic spray unit 32 is shown in FIG. 4. It contains circumferentially arranged rollers 48a, 48b, 48c, etc., of which the roller 48a is a driving roller and the remaining rollers 48b, 48c, etc. are idler rollers. The drive roller 48a is driven from an adjustable-speed motor 50. The drive roller 48a and idler rollers 48b, 48c, . . . are arranged in such a way that there is always a minimal radial or edge contact and no surface contact along front or backside of the wafer W during processing/cleaning. The rapid pulse harmonic spray unit 32 has the head assembly 33 (FIG. 5) that holds the drive and idler rollers. The roller mechanism is mounted with different diameter rollers to hold semiconductor wafer of varying size from 75 mm to 300 mm and above. The upper part 33a of the head assembly is moveable in a vertical direction on guides 35a and 35b to provide insertion of the wafer W.

Figure 5:
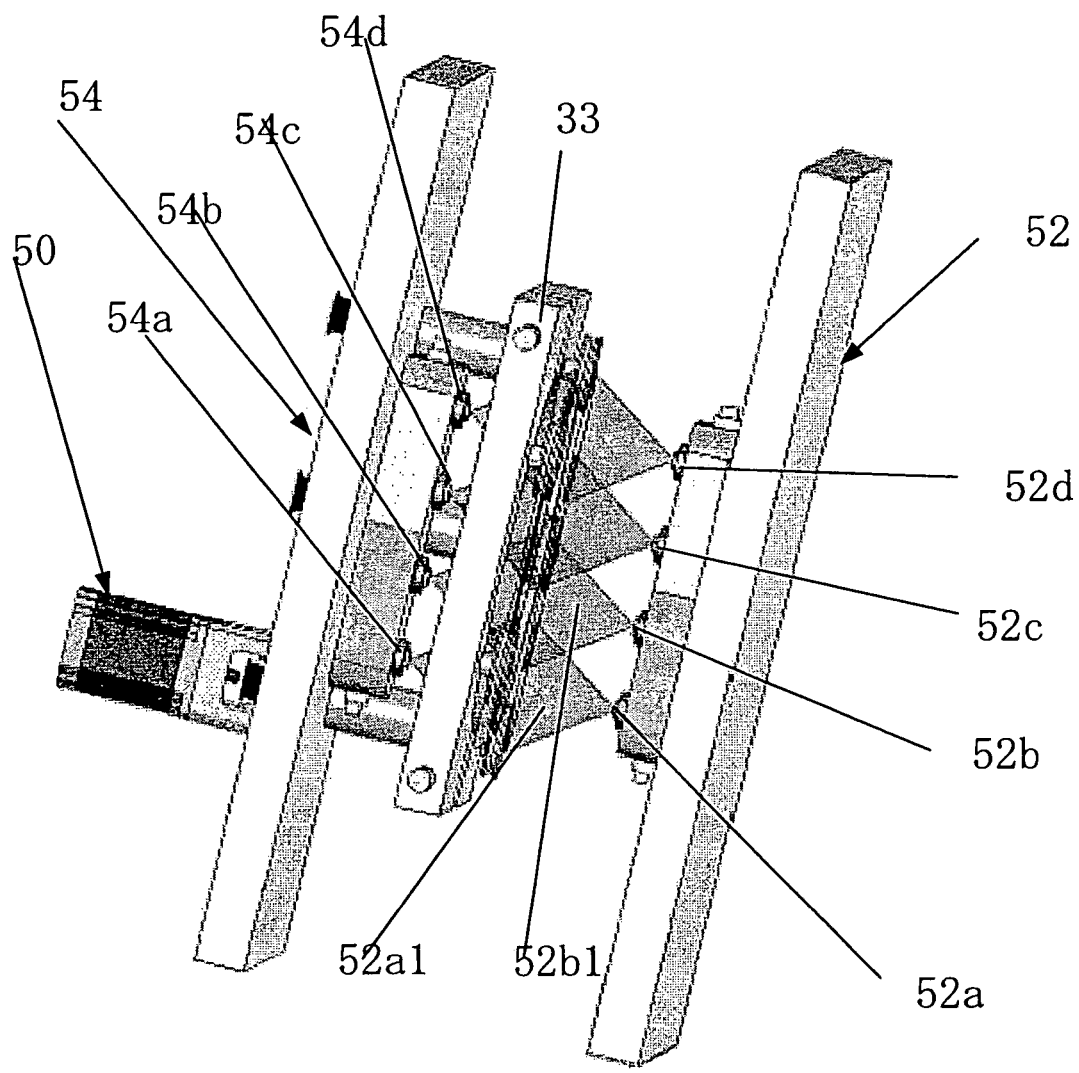
FIG. 5 is a fragmental three-dimensional view of a rapid pulse harmonic spray unit illustrating positions of the nozzles relative to the wafer.

The chamber also contains stationary nozzle arrays 52 and 54 positioned on both sides of the vertical wafer W diametrically across the wafer W to clean front and back surface of the wafer in a simultaneous process. The arrangement of the stationary nozzle arrays 52 and 54 is shown in FIG. 5. In the illustrated embodiment, each of the nozzle arrays contains four nozzles. Thus the nozzle array 52 contains nozzles 52a, 52b, 52c, and 52d, while the nozzle array 54 contains nozzles 54a, 54b, 54c, and 54d. The nozzles operate in so-called rapid pulse harmonic spray mode. In this mode, the nozzles inject discrete droplets of pulsed fluid streams of specific size selected to match a specific application. The nozzles use a stream of discreet droplets of fluid (deionized water or other) that is fired in rapid succession using a harmonic pulsed system (Rapid Pulse Clean system, RPC). Ultra-pure chemicals are also sprayed in the chamber depending upon the cleaning step requirement. Acids as well as bases can be sprayed to clean the wafer, front and back side. Planar Semiconductor's water-soluble PAD series chemistries can also be sprayed for a variety of back end of the line and front end of the line wafer cleaning applications. Planar's PAD series chemistries offer an environmentally friendly alternative to RCA chemistries.

The jets 52*a*1, 52*b*1 ... 54*c*1, and 54*d*1 (FIG. 5) are created by means of an electrical three-diaphragm short piston pump (not shown). Cleaning is carried out with the use of predetermined ultra pure chemistries along with deionized-water rinsing of the wafer surface. Rapid pulsed streams of chemistry and deionized water are fired in timed succession to clean and rinse the wafer surface, front and backside, although it is not a requisite to clean the back side if not desired.

Figure 6:
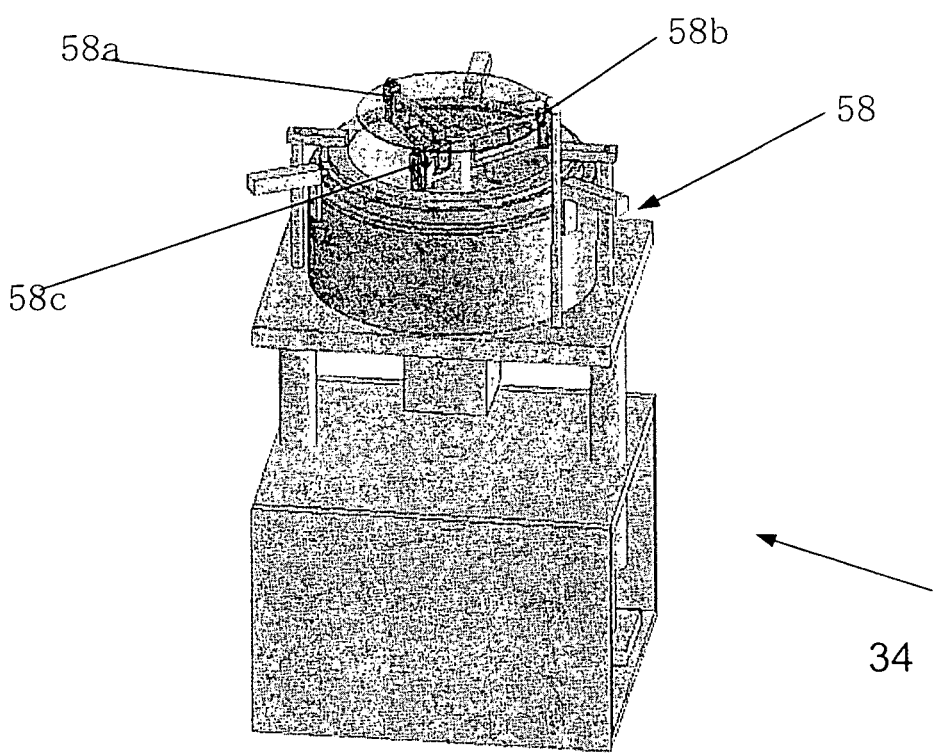
FIG. 6 is a general three-dimensional view of the wafer drying unit of the apparatus.
Figure 7:
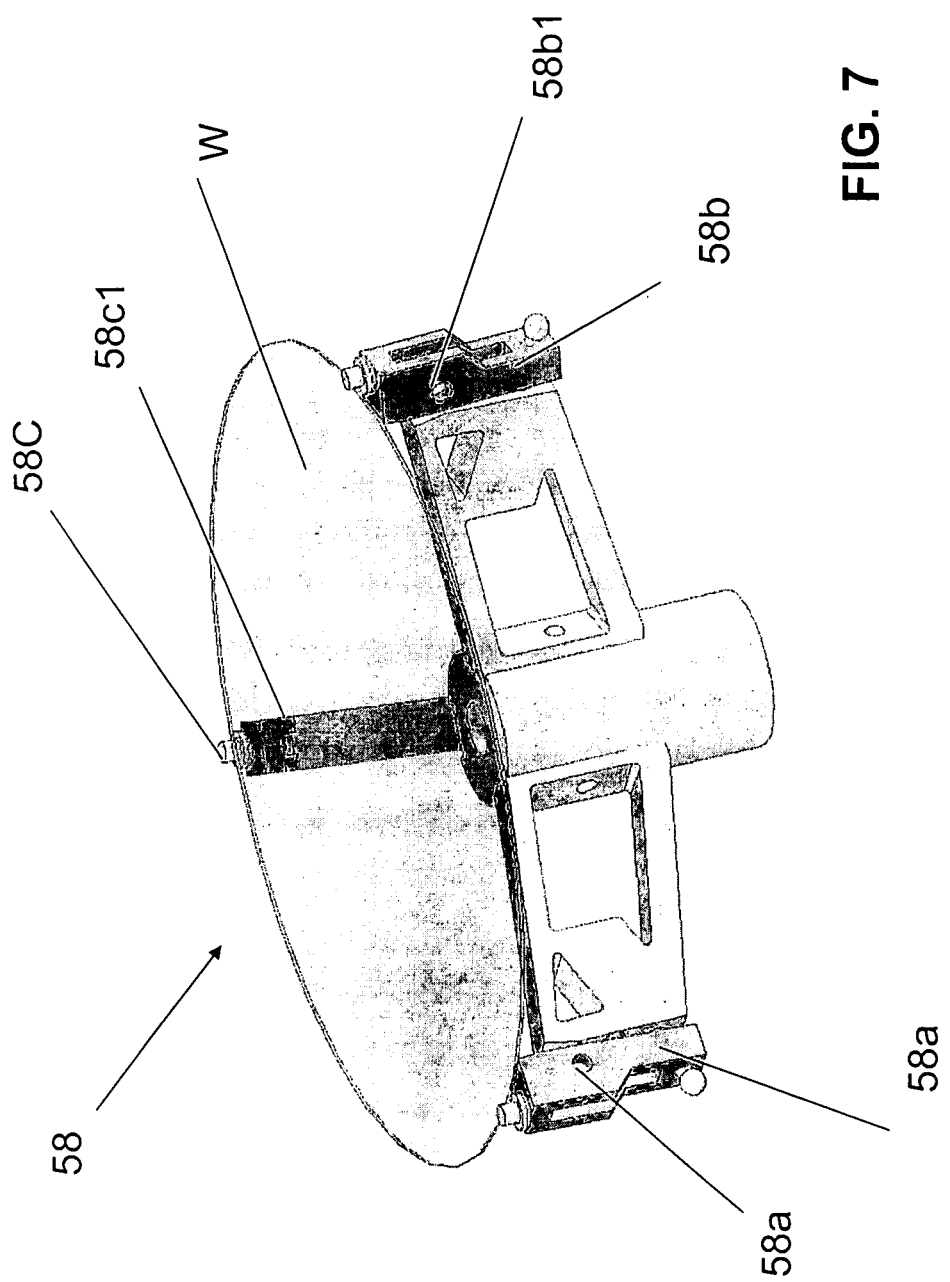
FIG. 7 is a three-dimensional view of a wafer holding and rotation mechanism of the drying unit.

The next unit in the clockwise rotation of the robot arm is the drying unit 34. This unit is shown in FIG. 6, which is a three-dimensional view. It is intended for drying a wafer W, cleaned in the rapid pulse harmonic spray unit 32, in a horizontal position. In other words, when the robot arm 26 transfers the wafer W processed in the rapid pulse harmonic spray unit 32, it picks up the vertically oriented wafer W from the unit 32 with the use of the second end-effector 38 in a vertical position and flips it into a horizontal position for placing into a chuck 58 of the drying unit 34 (FIG. 6). The chuck 58 has a gripping mechanism which is shown in FIG. 7. This gripping mechanism is formed by three centrifugally operated gripping fingers 58*a*, 58*b*, 58*c*. The chuck is driven into a rotation from a motor (not shown). When the chuck begins to rotate, the weights of the gripping fingers rotate under the effect of the centrifugal forces around their pivots 58*a*1, 58*b*1, 58*c*1 in a counter-clockwise direction, whereby the opposite arms of the pivoted gripping fingers grip the circumferential edges of the wafer W with soft touch.

Optional use of heated or room-temperature nitrogen can be used to quickly dehydrate the object surface from moisture in order to prevent any water spots formation on the surface. The nitrogen is supplied from a nitrogen bottle or other source (not shown).

The system uses an off the shelf motion control system that is controlled by a central host computer which is further linked to the semiconductor fabrication facility host via SECS/GEM protocol. The system motion controller performs all the input output functions without having to rely on a complex array of software commands. The system has a built in device net redundancy to provide advanced diagnostic capabilities. Most of the system control software is off the shelf and does not rely on complex customized algorithmic programming for performance. The system controls utilize a PLC control logic that incorporates a variable frequency driver to control/change the pulsing of the pump. The control system is beyond the scope of the present invention.

Figure 8:
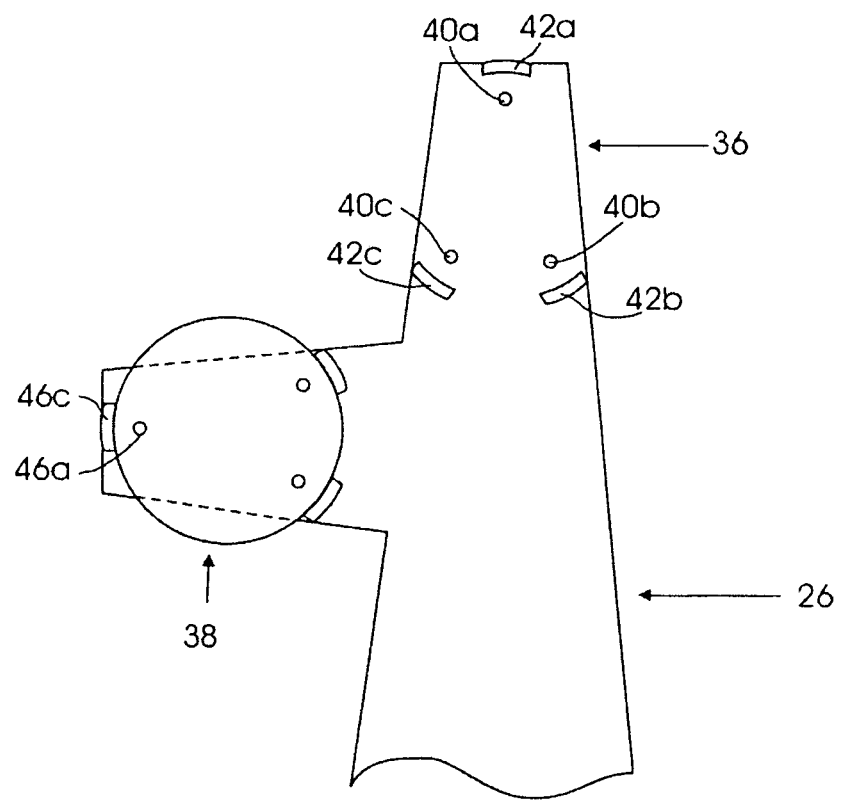
FIG. 8 shows the robot with the robot arm in a vertical plane with the wafer held in the second end-effector for extracting the processed wafer from the cleaning unit.

The apparatus 20 operates as follows:

The wafer W is taken by the first end-effector 36 (FIG. 3) of the robot arm 26 from the input wafer cassette 28 (FIG. 2) in a horizontal position, which is more convenient for storage, and is flipped into a vertical position, which is more efficient for cleaning in a cleaning module 32. This is done by manipulating the robot 24 around its respective axis so that in a manner known in the art the first end-effector 36 is inserted into the slot of the input wafer cassette 28 selected by the central processing unit and picks up the wafer from the cassette 28. The robot arm 26 then withdraws the end-effector 36 with the wafer W gripped in it from the cassette 28 and turns it so that the wafer is oriented in a vertical plane. This is shown in FIG. 8.

The robot arm 26 moves the vertically oriented wafer W towards the gate 35 of the rapid pulse harmonic spray unit 32. As the end-effector passes through the open valve gate 35 of the rapid pulse harmonic spray unit 32, it places the wafer between the rollers for processing. In this stage, the upper part 33*a* of the head 33 is raised (FIG. 4). The upper part 33*a* moved down for fixing the wafer between the rollers 48*a*, 48*b*, etc. The end-effector is removed from the cleaning chamber, and the gate 35 is closed by the command from the CPU. Once the chamber closes, the processing of the wafer starts. The wafer W is now cleaned while it is rotating at a variable speed and processed in accordance with the procedure in a vertical orientation. The speed variation band is 0-200 rpm. Rapid Pulsed streams of chemistry and DI water are fired in timed succession to clean and rinse the wafer surface, front and backside as shown in FIG. 5, although it is not a requisite to clean the back side if not desired. Meanwhile, the robot 24 turns its arm 26 in the vertical plane to such a position that prepares the "clean wafer" end-effector 38 (FIG. 3) for picking up the vertically-oriented processed wafer W from the cleaning unit 32.

Once the wafer W is cleaned based upon the application or the cleaning step the wafer W is then picked up from the pulse clean chamber of the pulse harmonic spray unit 32 by the second end-effector 38, the robot arm 26 is turned to a horizontal plane and delivers the processed wafer W to the horizontal spin dryer 34 that uses a unique four quadrant exhaust system to spin dry the wafer W without splash back. FIG. 9 shows the robot with the robot arm in a horizontal plane with the wafer held in the second end-effector for introduction of a processed wafer to the drying unit. Optional use of heated or room-temperature Nitrogen can be used to dehydrate the wafer quickly to prevent any water spots formation on the surface. Optional spray of solvent based Planar's PAD series chemistry or dilute solvent can also be sprayed in the dry chamber to allow for re-wetting and ultra fast drying purposes.

After the dry step the wafer is delivered without changing its horizontal position to the output cassette 30 (FIG. 2) by the robot 24.

Thus, it has been shown that the invention provides an apparatus for cleaning flat objects such as semiconductor wafers that has a compact design, ensures the highest degree of cleaning in handling the wafers by using separate end effectors for uncleaned and cleaned objects, is characterized by a vertical arrangement of the object plane, efficiently removes contaminants from the object surface with pulsed jets of the cleaning liquid, completely removes the drops of the cleaning liquid from the surface of the object during drying, and stabilize the cleaning by selecting an appropriate pulse spray modes. The invention also provides an improved method of cleaning flat objects such as semiconductor wafers that is characterized by high cleaning efficiency due to the use of pulsed jets and by high drying efficiency due to the use of a special turbo-spin dry module that may optionally operate in combination with a nitrogen blow.

Although the invention has been shown and described with reference to specific embodiments, it is understood that these embodiments should not be construed as limiting the areas of application of the invention and that any changes and modifications are possible, provided that these changes and modifications do not depart from the scope of the attached patent claims. For example, the units shown in the drawings can be arranged for sequential movement of the robot arm in a counter-clockwise direction or in any other radial or linear arrangement.

The invention claimed is:

1. An apparatus to clean a flat object in a substantially vertical orientation with a pulsed liquid jet, the apparatus comprising:
    an industrial robot with a mechanical arm; and
    a plurality of individual processing units arranged around the industrial robot, the plurality of individual processing units including a flat object input and output means, a flat object cleaning unit configured to hold the flat object in the substantially vertical orientation, and a flat object drying unit;

the flat object cleaning unit including a rapid pulse harmonic spray unit;

the industrial robot having degrees of freedom sufficient to reach each of the plurality of individual processing units, to transfer the flat object between the plurality of individual processing units;

the flat object cleaning unit including:
a flat object holding and driving mechanism including a plurality of roller holders and a flat object drive roller engageable with only an edge of the flat object, there being no surface contact between any portion of the plurality of rollers with either a front surface or a back surface of the flat object, the plurality of rollers thereby being configured such that each of the surfaces of the flat object are cleaned to the edge of the flat object with no portion of either the front surface or the back surface of the flat object failing to be cleaned due to interference from the plurality of rollers, at least some of the roller holders being moveable between a first position in which the flat object drive roller is spaced apart a first distance from the at least some of the roller holders for insertion of the flat object into the flat object holding and driving mechanism and a second position in which the flat object drive roller is spaced apart from the at least some of the roller holders a second distance, the second distance being less than the first distance, for engagement with the edge of the flat object and the driving mechanism for the rollers, the flat object drive roller arranged to have no surface contact along either the front surface or the back surface of the flat object during a cleaning operation, the flat object holding and driving mechanism being configured to rotate the flat object in the substantially vertical orientation at a variable speed during the cleaning operation; and the rapid pulse harmonic spray unit including at least one stationary nozzle head located on each side of the flat object, each at least one stationary nozzle head including a plurality of stationary cleaning medium spray nozzles positioned substantially diametrically across each surface of the flat object, with each of the plurality of stationary cleaning medium spray nozzles being stationary with reference to the apparatus with the plurality of stationary cleaning medium spray nozzles on each at least one nozzle head directed towards a respective side of the flat object installed in the flat object holding and driving mechanism and configured to direct pulsed jets of a cleaning liquid to the front surface and the back surface of the flat object simultaneously and substantially perpendicular to the each surface of the flat object, the plurality of cleaning medium nozzles being configured to change a jet outflow speed of the pulsed jets during the cleaning operation.

2. The apparatus of claim 1, wherein the industrial robot and the plurality of individual processing units are enclosed in a sealed and filtered enclosure having means for controlling a degree of cleanliness of the atmosphere in the enclosure.

3. The apparatus of claim 2, wherein the industrial robot has a first end effector to handle the flat object prior to loading into the cleaning unit and a second end effector to handle the flat object after cleaning in the flat object cleaning unit.

4. The apparatus of claim 3, wherein the first end effector and the second end effector are coupled to the mechanical arm of the industrial robot and are arranged in different planes with respect to each other.

5. The apparatus of claim 4, wherein the different planes are arranged at about 90° with respect to each other.

6. The apparatus of claim 5, wherein the flat object is selected from the group consisting of a semiconductor wafer, a semiconductor wafer substrate, a hard disk, a hard disk substrate, a compact disk, and a compact disk substrate.

7. The apparatus of claim 5, wherein the flat object drying unit includes a rotatable chuck with a gripping mechanism to grip the flat object, the gripping mechanism including at least three gripping fingers moveable between a flat object receiving position and flat object gripping position.

8. The apparatus of claim 7, wherein the at least three gripping fingers are pivotally engageable with the edge of the flat object and configured to move from the flat object receiving position to the flat object gripping position under the effect of a centrifugal force developed during rotation of the rotatable chuck for soft contact with the edge.

9. The apparatus of claim 3, wherein the flat object drying unit includes a rotatable chuck with a gripping mechanism to grip the flat object, the gripping mechanism including at least three gripping fingers moveable between a flat object receiving position and flat object gripping position.

10. The apparatus of claim 9, wherein the at least three gripping fingers are pivotally engageable with the edge of the flat object and configured to move from the flat object receiving position to the flat object gripping position under the effect of a centrifugal force developed during rotation of the rotatable chuck for soft contact with the edge.

11. The apparatus of claim 1, wherein the flat object drying unit includes a rotatable chuck with a gripping mechanism to grip the flat object, the gripping mechanism including at least three gripping fingers moveable between a flat object receiving position and flat object gripping position.

12. The apparatus of claim 11, wherein the at least three gripping fingers are pivotally engageable with the edge of the flat object and configured to move from the flat object receiving position to the flat object gripping position under the effect of a centrifugal force developed during rotation of the rotatable chuck for soft contact with the edge.

13. The apparatus of claim 1, wherein the flat object is selected from the group consisting of a semiconductor wafer, a semiconductor wafer substrate, a hard disk, a hard disk substrate, a compact disk, and a compact disk substrate.

14. The apparatus of claim 1, wherein the holding and driving mechanism is configured to rotate the flat object in the substantially vertical orientation at a variable speed variation band greater than 0 rotations per minute (rpm) to about 200 rpm.

15. A method for cleaning a flat object, the method comprising:
providing a flat object cleaning apparatus comprising an industrial robot with a mechanical arm and plurality of individual processing units arranged around the industrial robot, the individual processing units comprising at least a flat object input and output means, a flat object cleaning unit including a flat object holding and driving mechanism and having a plurality of roller holders to hold the flat object only on edges of the flat object and not on either a front surface or a back surface of the flat object and at a substantially vertical orientation, there being no surface contact between any portion of the plurality of rollers with either a front surface or a back surface of the flat object, the flat object cleaning unit thereby being configured such that each of the surfaces of the flat object are cleaned to the edge of the flat object with no portion of either the front surface or the back surface of the flat object failing to be cleaned due to interference from the flat object cleaning unit, and a flat object drying unit; the flat object cleaning unit comprising a stationary rapid pulse harmonic spray unit; the industrial robot having degrees of freedom sufficient for reaching any of the individual processing units and for transferring the flat objects between any of the individual processing units, the mechanical arm supporting a first end effector to hold the flat objects prior to cleaning in the cleaning unit and a second end effector to handle the flat objects after cleaning in the cleaning unit;

extracting a flat object from the flat object input means by means of the first end effector and transferring the flat object to the cleaning unit for cleaning in the substantially vertical orientation;

rotating the flat object in the substantially vertical orientation at a variable speed variation band of greater than about 0 rotations per minute (rpm) to about 200 rpm;

simultaneously cleaning both the front surface and the back surface of the flat object in the substantially vertical orientation by means of a plurality of nozzles on either side of the flat object, positioned substantially diametrically across each surface of the flat object the plurality of nozzles being stationary with regard to the flat object cleaning apparatus, the plurality of nozzles being configured to emit jets of a cleaning medium emitted onto both surfaces of the flat object that is substantially perpendicular to the surface of the flat object in a pulse mode from the stationary rapid pulse harmonic spray unit;

during the cleaning, changing a jet outflow speed of the jets;

removing the flat object upon completion of the cleaning from the cleaning unit with the use of the second end effector and transferring the flat object to the drying unit to dry the flat object; and removing the flat object from the drying unit upon completion of the drying operation with the use of the second end effector and loading the flat object to the flat object output means.

16. The method of claim 15, further comprising rotating the flat object during the drying to dry in a spin-dry manner.

17. The method of claim 16, wherein the drying in a spin-dry manner is further combined with a chemical treatment for accelerating the step of the drying and for improving a quality of the drying.

18. The method of claim 17, wherein the chemical treatment is treating the flat object during the spin drying chemistry and deionized water fired in timed succession in a direction perpendicular to the surface of the flat object to clean and rinse surface of the flat object.

* * * * *

UNITED STATES PATENT AND TRADEMARK OFFICE
CERTIFICATE OF CORRECTION

PATENT NO. : 9,799,536 B2
APPLICATION NO. : 11/269250
DATED : October 24, 2017
INVENTOR(S) : Rubinder Randhawa Page 1 of 1

It is certified that error appears in the above-identified patent and that said Letters Patent is hereby corrected as shown below:

In the Claims

In Column 13, Line 30, in Claim 15, delete "object," and insert --object-- therefor In Column 14, Line 1, in Claim 15, delete "object" and insert --object,-- therefor In Column 14, Line 5, in Claim 15, after "medium", delete "emitted"

Signed and Sealed this
Twenty-fifth Day of June, 2019

Andrei Iancu
*Director of the United States Patent and Trademark Office*